(12) United States Patent
Norskov et al.

(10) Patent No.: US 6,714,091 B2
(45) Date of Patent: Mar. 30, 2004

(54) VCO WITH PROGRAMMABLE OUTPUT POWER

(75) Inventors: Soren Norskov, Copenhagen (DK); Carsten Rasmussen, Copenhagen (DK); Niels Thomas Hedegaard Povlsen, Lyngby (DK)

(73) Assignee: Nokia Mobile Phones Limited, Espoo (FI)

( * ) Notice: Subject to any disclaimer, the term of this patent is extended or adjusted under 35 U.S.C. 154(b) by 0 days.

(21) Appl. No.: 09/739,230

(22) Filed: Dec. 19, 2000

(65) Prior Publication Data

US 2001/0011928 A1 Aug. 9, 2001

(30) Foreign Application Priority Data

Dec. 21, 1999 (GB) .............................................. 9930241

(51) Int. Cl.[7] ................................................ H03B 5/24
(52) U.S. Cl. ........................ 331/185; 331/182; 331/186; 331/74
(58) Field of Search .......................... 331/1 R, 74, 185, 331/186, 175, 182; 323/282

(56) References Cited

U.S. PATENT DOCUMENTS

| | | | | |
|---|---|---|---|---|
| 5,016,260 A | * | 5/1991 | Masuda | .................. 331/107 A |
| 5,175,884 A | | 12/1992 | Suarez | ........................ 455/260 |
| 5,179,358 A | * | 1/1993 | Martin | ........................ 331/1 A |
| 5,767,791 A | | 6/1998 | Stoop et al. | |
| 5,818,306 A | | 10/1998 | Lee et al. | |
| 5,852,386 A | * | 12/1998 | Chantry et al. | ............. 331/94.1 |

FOREIGN PATENT DOCUMENTS

| | | |
|---|---|---|
| EP | 0854566 | 11/1997 |
| WO | WO 00/76384 | 11/2000 |

* cited by examiner

*Primary Examiner*—Arnold Kinkead
(74) *Attorney, Agent, or Firm*—Antonelli, Terry, Stout & Kraus, LLP

(57) ABSTRACT

Voltage controlled oscillator assembly which includes at least one voltage controlled oscillator, and a regulator for regulating the output power from the at least one voltage controlled oscillator.

13 Claims, 2 Drawing Sheets

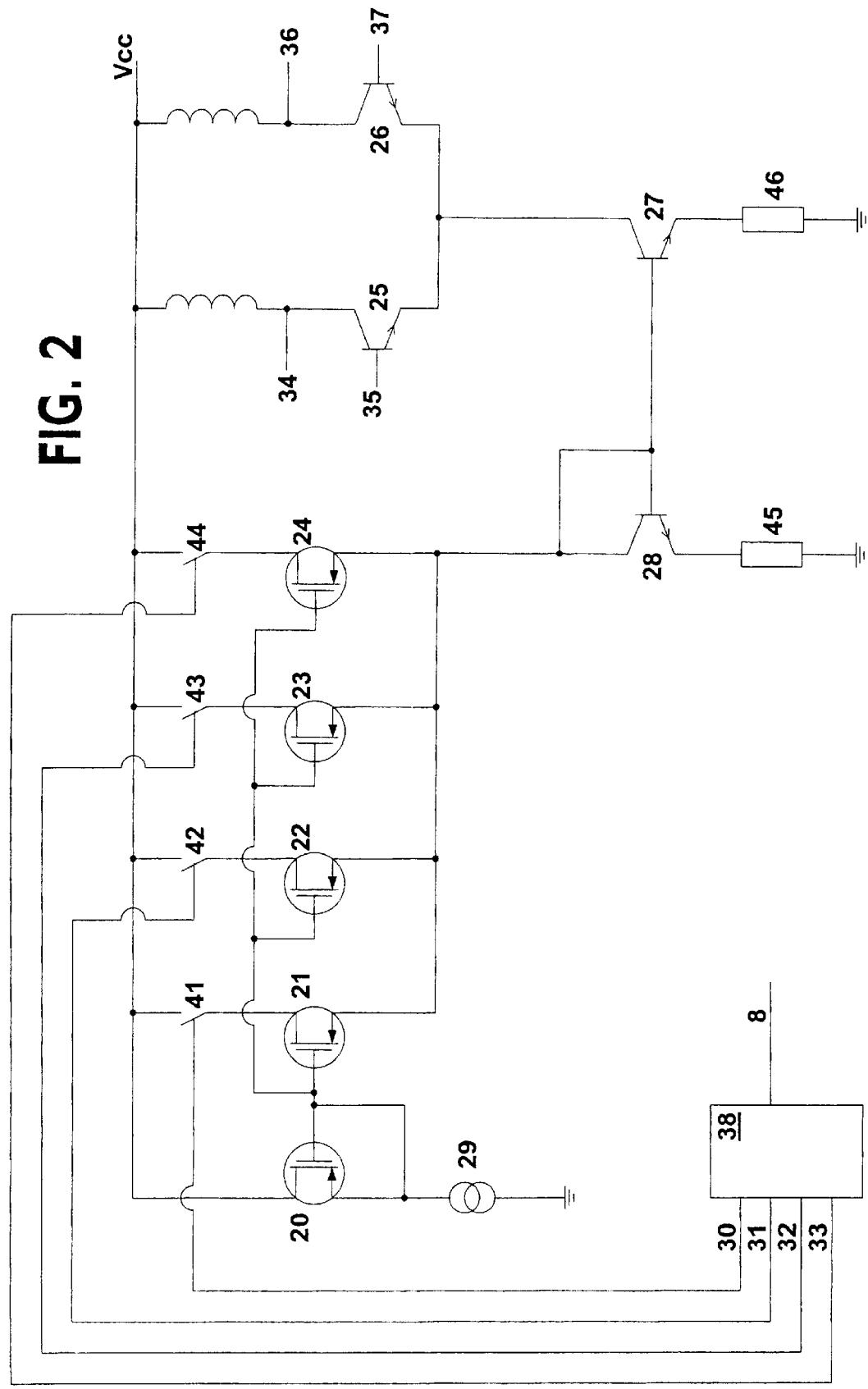

VCO WITH PROGRAMMABLE OUTPUT POWER

BACKGROUND OF THE INVENTION

1. Field of the Invention

The present invention relates to voltage controlled oscillators, and more specifically it relates to regulation of the output signal level from voltage controlled oscillators, when used in different applications, further the invention relates to a method for reducing losses in phase locked loops using voltage controlled oscillators.

2. Description of the Prior Art

Voltage controlled oscillators are widely used in generating various frequencies within a specified frequency band.

Typically for such uses the voltage controlled oscillator is incorporated in a phase locked loop.

Such a phase locked loop may incorporate a reference oscillator, a phase detector, a low pass filter, a programmable divider and a voltage, controlled oscillator, all co-operating in the following manner.

The reference oscillator, typically a crystal oscillator, generates a fixed frequency which is supplied to the phase detector on a first line. The phase detector compares the phase of the signal on the first line with the phase of a frequency signal on a second line originating from the voltage controlled oscillator. This frequency signal from the voltage controlled oscillator may be divided down by a programmable divider before the phase comparison in the phase detector takes place. Based on the comparison, the phase detector generates an error signal on a third line, via which it is input to the voltage controlled oscillator. The error signal is in the form of a control voltage signal for the voltage controlled oscillator. Based on the control voltage signal the voltage controlled oscillator generates an output signal on an output line. This signal is at a different frequency from the fixed frequency, depending on the division ratio of the programmable divider.

When using a voltage controlled oscillator in a phase locked loop in modern mobile communications, the operating frequency will typically be in the vicinity of 4 GHz. This signal may then conveniently be divided down with integer factors of 2, 4 and 8, thereby achieving frequencies in the most commonly used frequency bands around 1800 MHz, 1900 MHz, 900 MHz and 450 MHz.

However, operating a phase locked loop at 4 GHz in a mobile phone involves some problems.

At these frequencies the transmission of signals between individual parts of circuit in which the voltage controlled oscillator is incorporated depend very much on the actual design of the circuit in which the voltage controlled oscillator is incorporated. In fact it may in some cases even be a problem transmitting the signal from the voltage controlled oscillator to the programmable divider.

Increasing the output power of the voltage controlled oscillator may in some cases be a way around this problem.

However, it is generally undesired to increase power consumption anywhere in a mobile phone because they are generally battery powered. In fact quite a lot of effort has been put into decreasing the overall power consumption of mobile phones, in order to allow long standby times and long talk times without having to recharge the battery.

Further, programmable dividers for the use at 4 GHz are generally sensitive to too powerful signals.

One reason for this is that their design is inherently unstable, in order to be able to achieve the necessary operating speed for such high frequencies. Thus they are more prone to counting errors resulting in overtones in the output signal when the input signal is too powerful.

Since the voltage controlled oscillator is to be used in different mobile telephone constructions where it has to be ensured both that there is sufficient signal and that the signal is not too powerful, the output power has to be adjusted to the actual application.

Traditionally this has been done by having a voltage controlled oscillator with comparably high output power, and then having an attenuator in the circuit in which the voltage controlled oscillator is incorporated, in order to be able to attenuate the signal if it proves necessary in the particular application. In a phase locked loop the attenuator is found between the output of the voltage controlled oscillator and the input of the programmable divider.

As mentioned earlier, this is in mobile phones in contradiction to the overall object of reducing power consumption.

The present invention provides a voltage controlled oscillator, which may be used in a variety of applications, yet does not suffer from the above drawbacks.

SUMMARY OF THE INVENTION

According to the invention a voltage controlled oscillator comprises a voltage controlled oscillator assembly including means for regulating the output power from the at least one voltage controlled oscillator.

The invention reduces losses when using a voltage controlled oscillator in a phase locked loop.

According to the invention a method for reducing losses in a phase locked loop includes a micro-controller, arranged on the same chip as the voltage controlled oscillator, is used for regulating the level of the output signal from the voltage controlled oscillator chip.

BRIEF DESCRIPTION OF THE DRAWINGS

FIG. 2 illustrates a circuit diagram of the output stage of a voltage controlled oscillator assembly according to the invention.

DETAILED DESCRIPTION OF THE PREFERRED EMBODIMENTS OF THE INVENTION

Figure 1:
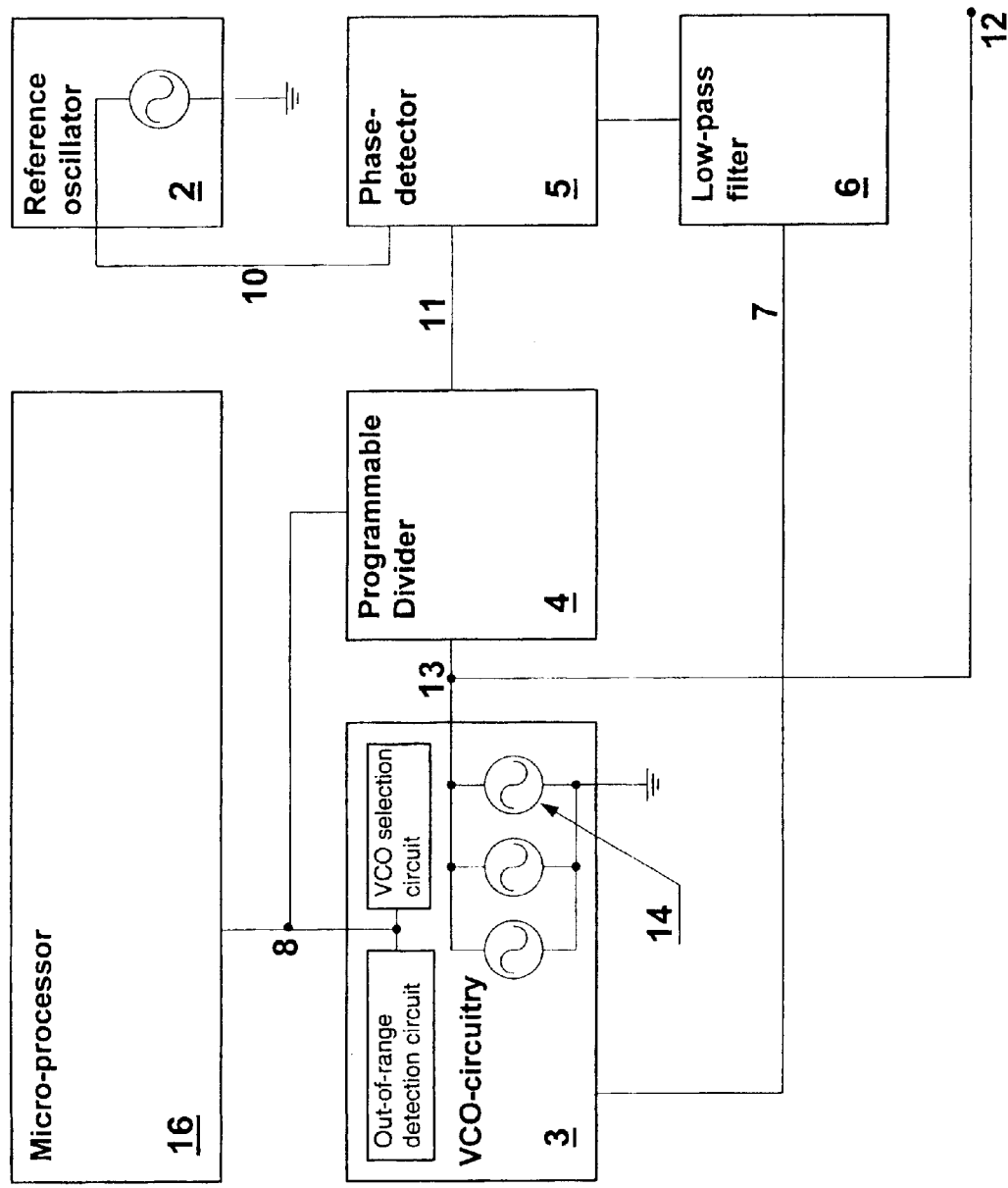
FIG. 1 illustrates a phase locked loop incorporating a voltage controlled oscillator assembly 3 according to the invention.

The invention will now be explained in greater detail, based on the following description of an exemplary, non-limiting, preferred embodiment and using the enclosed drawing.

As can be seen in FIG. 1, the phase locked loop incorporates a reference oscillator 2, a phase detector 5, a low pass filter 6, a programmable divider 4 and a voltage controlled oscillator assembly 3 comprising at least one voltage controlled oscillator 14.

These elements co-operate in the following manner.

The reference oscillator 2, typically a crystal oscillator, generates a fixed frequency which is supplied to the phase detector 5 on a first line 10. The phase detector 5 compares the phase of the signal on the first line 10 with the phase of a frequency signal on a second line 11 originating from the voltage controlled oscillator. This frequency signal from the voltage controlled oscillator may be divided down by the programmable divider 4 before the phase comparison in the phase detector 5 takes place. Based on the comparison, the phase detector 5 generates an error signal on a third line 7, via which it is input to the voltage controlled oscillator 14. The error signal is in the form of a control voltage signal for the voltage controlled oscillator 14. Based on the control voltage signal, the voltage controlled oscillator 14 generates an output signal on an output line 13. This signal is at a different frequency from the fixed frequency, depending on the division ratio of the programmable divider 4.

From the output line 13 the actual signal of interest is tapped via a line 12. In the line 12 there may optionally be incorporated a second divider (not shown) used to divide the signal of interest down to a frequency desired for a specific use.

According to the invention, the line 13 connects the output of the voltage controlled oscillator assembly 3 directly to the programmable divider 4, without any intermediate stages such as attenuators.

In FIG. 2 is shown a simplified circuit diagram of an embodiment of the output stage of a VCO according to the invention. Two output transistors 35 and 37 are biased by a current mirror comprising two transistors 27 and 28. The differential oscillator signal (not shown) is fed to the two input terminals 35 and 37, the differential output signal is available at two output terminals 34 and 36. A current multiplier sets the current in the current mirror. The current multiplier operates as follows: A current source 29 sets the current in MOSFET (Metal Oxide Semiconductor Field Effect Transistor) 20. Another MOSFET 21 is identical to MOSFET 20, thus the currents in the two MOSFETS 21, 22 are the same. MOSFET 22 is chosen, so that for a given gate-source voltage, the current is two times the current through the MOSFET 20 with the same gate-source voltage. Likewise, a MOSFET 23 is chosen so that the current for a given gate-source voltage is 4 times that of the MOSFET 20, and a MOSFET 24 is chosen so that the current for a given gate-source voltage is 8 times that of the MOSFET 20. MOSFETs 21–24 can be switched in and out of the circuit by four switches 41–44. The switches 41–44 are controlled by digital circuit 38 comprising a memory and a bus interface circuit capable of receiving calibration information from e.g. a micro-controller. The logical levels on four digital signal lines 30–33 are determined by the calibration information being sent to a digital circuit 38 through the bus 8. For example, if the current source 29 sets the current through the MOSFET 20 to 10 mA and the switches 41 and 44 are closed, corresponding to a logic level "1" on the signal lines 30 and 33 (the switches 42 and 43 are open corresponding to logic level "0" on the signal lines 31 and 32), the current through the transistor 27 and, thus the transistor 28, is 20 mA+80 mA=100 mA. This current is divided equally between the transistors 25 and 26, setting the bias current in each to 50 mA. As the output-power of transistors 25, 26 is proportional to the bias current, the output power of the VCO is seen to be digitally controlled (programmed).

The regulated output on the line 13 need not be derived directly from the voltage controlled oscillator itself, but via an amplifier or buffer associated with the voltage controlled oscillator within the voltage controlled oscillator assembly 3. i.e. on the same chip. In this case the regulation may be effected by regulating the amplification of the amplifier.

In order to regulate the output from the voltage controlled oscillator assembly 3, the assembly incorporates a micro-controller 16 which as an external connection which may be connected to an external bus 8. Via this external bus 8 the micro-controller 16 receives information about the output level required for the specific circuit configuration in which the voltage controlled oscillator assembly is placed. The voltage controlled oscillator assembly 3 is thus digitally programmable to deliver a specific output level.

This is particularly advantageous in applications such as mobile communication, which to a large extent depend on digital computing power anyway. Thus controlling the output power of the voltage controlled oscillator assembly via an already present bus 8, does not require any substantial additional circuitry. The bus 8 used could for instance be the same bus 8 as used for transmitting the division ratio to the programmable divider.

Thus the invention facilitates the use of the same integrated circuit containing the voltage controlled oscillator assembly 3, in a wide range of different circuits, because it is of less importance to adapt the layout and properties of these circuits to match the voltage controlled oscillator assembly.

Even though the above description has been given with reference to a voltage controlled oscillator it must be understood that the principle may also be applied in other circuits with different functions where a regulated power output is needed.

What is claimed is:

1. A voltage controlled oscillator assembly, comprising:
    at least one voltage controlled oscillator including an output stage and a micro-controller for digitally regulating output power from the at least one voltage controlled oscillator; and wherein
    the output power is controlled by applying a variable current bias to only the output stage and the output stage is within the at least one voltage controlled oscillator.

2. A voltage controlled oscillator assembly according to claim 1, wherein the micro-controller is on a chip on which the at least one voltage controlled oscillator is located.

3. A voltage controlled oscillator assembly according to claim 1, comprising an input which receives information which controls the output power.

4. A voltage controlled oscillator assembly according to claim 2, comprising an input which receives information which controls the output power.

5. A phase locked loop comprising a voltage controlled oscillator assembly according to claim 1.

6. A phase locked loop comprising a voltage controlled oscillator assembly according to claim 2.

7. A phase locked loop comprising a voltage controlled oscillator assembly according to claim 3.

8. A phase locked loop according to claim 5, comprising:
    a microprocessor which provides power control information to the microcontroller to control the output power from the at least one voltage controlled oscillator.

9. A phase locked loop according to claim 6, comprising:
    a microprocessor which provides power control information to the microcontroller to control the output power from the at least one voltage controlled oscillator.

10. A phase locked loop according to claim 7, comprising:
    a microprocessor which provides power control information to the microcontroller to control the output power from the at least one voltage controlled oscillator.

11. A method of regulating output power from at least one voltage controlled oscillator with a micro-controller comprising:

provicing information to the micro-controller specifying an output level of power to be provided by the at least one voltage controlled oscillator including an output stage; and generating a control signal from the information which is applied as a variable current bias only to the output stage of the voltage controlled oscillator to control the output power of the at least one voltage controlled oscillator to be in accordance with the information specifying the output power; and wherein the output stage is within the at least one voltage controlled oscillator.

12. A method in accordance with claim 11, wherein:

the at least one voltage controller oscillator and the micro-controller is part of one integrated circuit; and the control signal controls current in the output stage.

13. A method in accordance with claim 12, wherein:

the output stage is a differential oscillator having differentially connected transistors; and the control signal controls a bias current of the differentially connected transistors.

* * * * *